United States Patent [19]

Bowden et al.

[11] 4,262,081

[45] Apr. 14, 1981

[54] FABRICATION BASED ON RADIATION SENSITIVE RESISTS OF HALO-ALKYL STYRENE POLYMERS

[75] Inventors: Murrae J. S. Bowden, Summit; Eugene D. Feit, Berkeley Heights; Larry F. Thompson, Gillette; Cletus W. Wilkins, Jr., Plainfield, all of N.J.

[73] Assignee: Bell Telephone Laboratories, Incorporated, Murray Hill, N.J.

[21] Appl. No.: 96,435

[22] Filed: Nov. 21, 1979

Related U.S. Application Data

[62] Division of Ser. No. 908,791, May 23, 1978.

[51] Int. Cl.³ .......................... G03C 1/68; G03C 5/00
[52] U.S. Cl. .......................... 430/280; 204/158 HE; 204/158 HA; 204/159.16; 204/159.17; 204/159.2; 204/159.22; 427/35; 427/36; 427/43.1; 427/44; 427/54.1; 430/275; 430/296; 430/313; 430/318; 430/323; 430/942; 430/967; 430/966; 526/293
[58] Field of Search ............... 430/275, 280, 296, 313, 430/318, 323, 942, 966, 967, 270; 427/35, 36, 54.1, 43.1, 44; 204/158 HE, 158 HA, 159.16, 159.17, 159.2, 159.22; 526/293; 525/334

[56] References Cited

U.S. PATENT DOCUMENTS

| | | | |
|---|---|---|---|
| 2,780,604 | 2/1957 | Clarke et al. | 526/293 X |
| 3,872,067 | 3/1975 | Harris | 526/293 X |
| 3,885,060 | 5/1975 | Hirai et al. | 430/28 X |
| 3,953,309 | 4/1976 | Gilano et al. | 430/281 X |
| 3,996,393 | 12/1976 | Cortellino et al. | 430/296 |
| 4,041,191 | 8/1977 | Leclerl et al. | 430/5 |
| 4,048,425 | 9/1977 | Kuntz | 526/293 X |
| 4,056,393 | 11/1977 | Schlesinger et al. | 430/363 |
| 4,061,799 | 12/1977 | Brewer | 430/296 |
| 4,061,829 | 12/1977 | Taylor | 430/272 X |
| 4,130,424 | 12/1978 | Feit et al. | 430/271 |

Primary Examiner—Edward C. Kimlin
Attorney, Agent, or Firm—George S. Indig

[57] ABSTRACT

Radiation sensitive negative resists with requisite stability for dry processing of integrated circuits are polymerized from aromatic moieties containing halogen atoms. Halogen-aryl bridging, generally carbonaceous, increases sensitivity to radiation. Exemplary materials, copolymers prepared from aromatic and glycidyl methacrylate (GMA) comonomers, are suitable for direct processing of large-scale integrated circuits. While electron beam patterning is contemplated both for direct processing and mask making, radiation such as X-ray and deep u.v. may be used.

5 Claims, No Drawings

FABRICATION BASED ON RADIATION SENSITIVE RESISTS OF HALO-ALKYL STYRENE POLYMERS

This is a division, of application Ser. No. 908,791, filed May 23, 1978.

BACKGROUND OF THE INVENTION

A. Technical Field

Fabrication of small circuits and circuit elements, e.g., large-scale integrated circuits (LSI) is realized through the one or more pattern delineation steps. In accordance with prevalent practice at this time, use is made of discrete masks which when finally processed, consist of apertured chromium patterns supported on glass substrates. Typically a set of six or more such masks are required for semiconductor circuit fabrication. They are utilized sequentially for replicating patterns in sensitive supported (resist) material on the semiconductor, following which the replicated pattern is utilized to define areas to be etched, plated, implanted, or otherwise processed. There is a growing technology which involves electron beam delineation to produce such masks with design rules of a few micrometers or less. Replication is generally accomplished with near u.v. light.

The expectation that economic and other considerations may lead to smaller design rules has focused attention on inherent limitations in presently used mask technology. Standing waves, interference and other limitations relating to wavelength have led to studies directed to the use of effectively shorter wavelength replicating radiation such as X-ray, electron flood, and short wavelength u.v. Anticipated yield loss due to registration difficulty with diminishing design rules is leading to evolution of a "maskless" technology known as "direct processing." In this technology, the primary pattern delineation is in resist layers made an intimate part of the device at each stage in fabrication. All such fine-line programs are dependent upon introduction of suitable resists.

B. History

A resist composition now in use in the fabrication of e-beam generated master masks is based on an addition polymer of glycidyl methacrylate (GMA) and ethyl acrylate (EA). Compositions in this category may be so formulated as to exhibit a useful sensitivity of $10^{-6}$ C/cm$^2$ (Coulombs per square centimeter) or better as well as a rubbery consistency assuring excellent adhesion during the wet processing of underlying metal layers of which the final hard copy mask is constituted (see, J. P. Ballantyne, *J. Vac. Sci. Technol.*, 12, 1257 (1975).

Materials exemplified by GMA-EA while of appropriate properties for fine-line delineation do not have optimal properties for all types of contemplated processing. In particular, dry processing, e.g., ion beam etching, ion implantation, sputter etching, etc., may result in degradation of the resist in the now-developed pattern, resulting in inadequate discrimination between bared and protected surface regions.

A category of negative resists still primarily dependent upon radiation-induced epoxy crosslinking depends upon inclusion of resonant moieties. One such material produced by copolymerization of GMA and styrene is disclosed in J. H. Rai and L. T. Shephard, *ACS Organic Coatings and Plastics Preprints*, 35 (2), 252 (1975). Inclusion of aryl rings results in some decrease in sensitivity to delineating radiation. A related category of materials depends upon halogenation to recoup some significant part of the sensitivity lost by introduction of resonant bonding (see Feit-Thompson Case 12-16, U.S. application Ser. No. 812,231, Filed July 1, 1977, now U.S. Pat. No. 4,130,424). Such resists show improved stability to the depolymerizing effect of many forms of dry processing while retaining sufficient delineation sensitivity to be candidates for production line use.

Recognizing the inherent stability of resonant structures others have utilized variations on such compositions in the formulation of direct processing resists. T. L. Brewer, Technical Papers, Regional Technical Conf., SPE, October 1973, p. 138 describes such a resist which in its exemplary form is simply a homopolymer of unsubstituted styrene.

Depending upon absorption characteristics, all such resists are usefully employed with electron beam as well as with X-ray and other short wavelength electromagnetic radiation.

SUMMARY OF THE INVENTION

A family of negative resist compositions depends upon polymerization of material including a monomer grouping containing a halogen atom bridged to an aryl group. Use of homopolymerized product, or preferably of copolymers with GMA or chemically related comonomers, assures sensitivity and other requisite patterning characteristics as well as a high degree of stability to the relatively harsh agents contemplated for use in dry processing. In all instances enhanced sensitivity is attributed to bridging, usually carbonaceous by nature, considered to remove labile halogens from the stabilizing influence of the resonant aryl grouping.

Inventive processes are based on variations of the included compositions. While widespread use is expected to take the form of direct circuit processing, incorporating one or more dry processing steps, immediate use may take the form of primary pattern mask fabrication or even replication patterning. Appropriate choice within the permitted formulation, e.g. choice and number of halogen atoms may assure an absorption cross section properly matched to a desired X-ray or other radiation source.

DETAILED DESCRIPTION

A. General

All aspects of the invention depend upon a specified category of resist compositions. Such compositions, all negative-acting, may be utilized with a variety of forms of actinic radiation; may be utilized in primary pattern delineation as by use of modulated electron beam, or, alternatively, in replication pattern delineation. Either approach may be utilized in device fabrication, in which event resists are present as tightly adherent, supported layers on the device undergoing processing. Included compositions, particularly exemplary copolymers, have sufficient sensitivity to compete with mask resists now in use. Again, delineation may be primary or secondary. In the former, delineation may be by e-beam in a resist layer supported by, e.g., a chromium-coated glass substrate. Mask substrate and underlying layers may vary depending upon the radiation to be used; e.g., supporting membranes of low x-ray absorption may replace glass or a coating of low work function material may be included for electron flood replication.

In general, the invention is described in terms of the preferred embodiment concerned with direct processing. Direct processing from a commerical standpoint most significantly involves silicon LSI although magnetic and other devices are contemplated. An important attribute of the inventive resists is stability to dry processing ambients—conditions under which many conventional resists are attacked.

B. Composition

Compositions of the invention may be structurally represented as

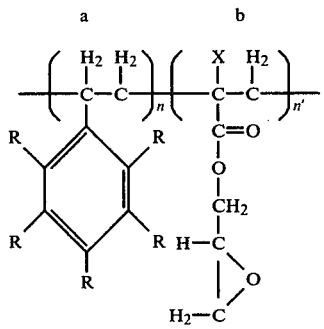

in which $X=H, CH_3, C_2H_5$, or other alkyl groups containing from 1-4 carbons; at least one of the R substituents is a grouping represented as $-R'Z$ in which the $R'Z$ grouping need not be identical and in which $Z$=halogen atom (F,Cl,Br,I); $R'$=any grouping containing from 1-4 atoms bridging the Z halogen to the aromatic ring. In general any other R substituents are hydrogen, methyl or higher alkyl homologue.

Since homopolymer a is contemplated n' may equal zero. For typical molecular weights (of the order of weight average molecular weight of $10^5$) and typical lithographic applications, required incident e-beam dose (sensitivity) may be $8 \times 10^{-6} C/cm^2$ at 20 kilovolts. Preferred compositions are copolymers of monomer units represented by a and b (either a or b comonomers may be non-identical). From this standpoint, n as well as n' has a desired range of from 0.2-0.8 with $n+n'=1$. For many purposes a preferred composition is more narrowly defined as $n=n'\pm 20$ percent with e-beam sensitivity for such a composition approximating $3 \times 10^{-6} C/cm^2$ at 20 kilovolts. Still assuming a molecular weight of the order of $10^5$, e-beam sensitivity may approximate $1 \times 10^{-6} C/cm^2$ while still retaining significant dry processing stability for a 0.3/0.7 n/n' copolymer.

Other considerations are common to resists in general. Spin coating from a solvent, a common coating procedure, is expediently practiced with weight average molecular weight range of from $10^3$ up to about $10^6$. Decreased solubility, as well as increased viscosity, may be a problem for significantly larger weight. A lower limit of about $10^3$ is dictated by sensitivity considerations. In common with other well engineered resists, molecular weight distribution defined as $M_w/M_n$ should be small; desirably less than three (the fraction $M_w/M_n$ represents weight average molecular weight divided by number average molecular weight). Narrow distribution is necessary for good contrast. Inclusion of other monomers, e.g., to improve adhesion is contemplated. For this reason the composition as structurally defined constitutes at least 80 weight percent of the polymer.

C. Material Preparation

The structural formula set forth in the preceding section is adequately descriptive of the desired end product. While a number of preparative routes are possible, usual monomeric material suggests addition polymerization. For expository purposes, resist materials of the invention are sometimes referred to as addition polymers (defining the usual polymerization route). The following discussion is in terms of addition polymerization.

Monomer starting material, generally contains a vinyl grouping. Monomer materials are obtained at a purity level of at least 99 percent or are processed, for example, by distillation to attain this purity level.

Polymerization is initiated by benzoyl peroxide or other free radical initiator useful in addition polymerization. Considerations in the choice of such materials are set forth in Polymer Handbook, "Decomposition Rates of Organic Free Radical Initiators," article by J. C. Masson, J. Brandrup and E. H. Immergut, Eds., Interscience (1966), pp. II-1 to II-54.

Appropriate selection of polymerization conditions may include selection of a chain transfer agent both in kind and amount, although the "a" monomer, e.g., chloromethylstyrene acts as a chain transfer monomer itself. In general, high viscosity of the monomer-solvent solution tends to increase the molecular weight distribution. It has been found that reaction mixture viscosities of about 40 centipoise or lower at the reaction temperature are desired. Temperature of the reaction mixture is increased both to accelerate polymerization and lower viscosity. A convenient temperature range is from 55 degrees C. up to 90 degrees C.

Percent conversion again represents a compromise—this time between conversion and molecular weight distribution. High conversion, results in increasing viscosity and attendant increase in molecular weight distribution. Conversion efficiency of 60 percent or less represents a reasonable compromise for most purposes.

D. Characterization of the Resist

Three physical properties characterize negative resist materials of the invention:
1. Useful radiation sensitivity levels;
2. High contrast;
3. Processing stability conveniently measured in terms of plasma etching of aluminum or aluminum alloys using the following conditions.

| | |
|---|---|
| Reactor: | 15" diameter parallel plate |
| Gas Mixture: | 75-95 Vol. % carbon tetrachloride, remainder helium. |
| Power: | 1,000-2,000 watts |
| Pressure: | 0.2-0.5 Torr |
| Flow rate: | 900-1500 cm$^3$/min for CCl$_4$ with He flow rate is adjusted to result in the desired total pressure. |
| Etch rate: | 800-1500 nanometers/min. Currently this is the most rigorous of all plasma etching conditions with the resist |

| frequently being subjected to temperatures in excess of 250 degrees C. |
|---|

Since aluminum etching represents one of the more harsh dry processing procedures, retention of sufficient resist under the conditions noted is indicative of sufficient stability for contemplated dry processing in general.

EXAMPLES

The following examples are chosen to illustrate appropriate polymerization conditions:

EXAMPLE 1

| Starting Ingredients | |
|---|---|
| 1. Glycidyl methacrylate | 15 ml |
| 2. Chloromethyl styrene | 15 ml |
| 3. Benzene | 250 ml |
| 4. Benzoyl peroxide | 42 mg |

Polymerization

Reaction is carried out in an inert atmosphere under reflux (presence of as little as 1 weight percent oxygen inhibits polymerization). The mixture is refluxed with external heating to result in a temperature of approximately 85 degrees C. for a period of six hours. Conversion after this time is about 20 percent. Following, the polymer is precipitated into methanol, a non-solvent for the polymer but a solvent for other included material. In this way, solvent material, as well as unreacted monomer, and initiator, are removed from the polymerized product. Other useful precipitation media include ethyl ether and petroleum ether.

Product

The mole ratio of a and b moieties, in accordance with the structural formula, is found to be equal to 0.48/0.52, as determined by elemental analysis—approximately corresponding with the ratio of initial monomeric material.

Weight average molecular weight as determined by gel permeation chromatography is found to be equal to approximately 76,000, with a molecular weight distribution $(M_w/M_n) = 2.0$. Lithographic sensitivity $D_g^{0.7}$ (dose required to achieve 70% the initial film thickness after development) expressed in units of Coulombs/cm$^2$ is found equal to $3.5 \times 10^{-6}$ upon exposure by a 20 kV electron beam using a resist layer thickness of approximately 1.0 micrometer. Contrast is approximately 1.7.

EXAMPLE 2

| Starting Ingredients | |
|---|---|
| 1. Glycidyl methacrylate | 30 ml |
| 2. Chloromethyl styrene | 30 ml |
| 3. Toluene | 500 ml |
| 4. Benzoyl peroxide | 80 mg |

Polymerization

Reaction is carried out under conditions similar to Example 1 except that the temperature is maintained at 85 degrees C. under argon.

Product

The resulting polymer, of a molecular weight of approximately 68,000, and a molecular weight distribution of approximately 1.7 has a sensitivity of about $2.5 \times 10^{-6}$ C/cm$^2$ under the conditions of Example 2.

EXAMPLE 3

| Starting Ingredients | |
|---|---|
| 1. Glycidyl methacrylate | 6 ml |
| 2. Chloromethyl styrene | 25 ml |
| 3. Benzene | 260 ml |
| 4. Benzoyl peroxide | 42 mg |

Polymerization

Reaction is carried out under conditions similar to Example 1.

Product

The resulting polymer, of a molecular weight of approximately 69,000, and a molecular weight distribution of approximately 2.2 has a sensitivity of about $4 \times 10^{-6}$ under the conditions noted. For many purposes, this copolymer of 78/22 a/b material represents a desirable compromise between dry processing stability and sensitivity.

EXAMPLE 4

| Starting Ingredients | |
|---|---|
| 1. Chloromethyl styrene | 100 ml |
| 2. Benzene | 500 ml |
| 3. Benzoyl peroxide | 35 mg |

Polymerizations and Product

Polymerization conditions similar to those of Example 1 results in a molecular weight of $1.69 \times 10^5$. Molecular weight distribution is approximately 1.9. E-beam sensitivity is $1.2 \times 10^{-6}$ C/cm$^2$ at 20 kV.

The homopolymer is considered a promising candidate for secondary pattern delineation with various radiation sources. Absorption cross-section for a far UV wavelength of approximately 250 nm may result in adequate exposure in a period of less than 10 minutes for presently available sources. The homopolymer is a candidate also for secondary delineation utilizing X-ray, as well as electron flood. As among the compositions of the invention, the homopolymer is the most stable to dry processing. Relatively high absorption cross-section and relatively high brightness of available replication radiation sources all favor the homopolymer for these purposes.

The four examples have been chosen to result in substantially invariant polymer characteristics (except Example 4 has a higher molecular weight). Comparison of lithographic results is a fair measure of dependence upon a/b ratio. Other work shows increasing sensitivity with increasing polymer weight. While cross-linking efficiency is dependent on choice of halogen atom for normalized absorption, this is a secondary consideration for preferred copolymers in which epoxy cross-linking is the predominant mechanism.

Molecular weight is controlled by the kinetics of chain transfer polymerization which, in turn, is dependent upon the ratio of monomer to chain transfer solvent and by the rate of initiator decomposition. These relationships, while complex and generally empirical, are well understood by those skilled in the art. Example 1 above under the conditions set forth, results in a molecular weight of about 76,000. The ingredients, but not the reaction conditions, are varied in Examples 5 and 6 below to result in the indicated values of $M_w$.

EXAMPLE 5

| | |
|---|---|
| 1. Glycidyl methacrylate | 20 ml |
| 2. Chloromethyl styrene | 20 ml |
| 3. Methyl ethyl ketone | 200 ml |
| 4. Benzoyl peroxide | 40 mg |
| $M_w \sim 40,000$ | |

EXAMPLE 6

| | |
|---|---|
| 1. Glycidyl methacrylate | 30 ml |
| 2. Chloromethyl styrene | 10 ml |
| 3. Methyl ethyl ketone | 400 ml |
| 4. Benzoyl peroxide | 40 mg |
| $M_w \sim 20,000$ | |

The relationship between molecular weight and sensitivity is of the general form of chemically related negative resists. See, for example, Feit-Thompson Case 12-16 referred to above showing this relationship for glycidyl methacrylate-ethyl acrylate copolymer. As expected, an increase in molecular weight results in a decrease in dose necessary to produce a desired degree of cross-linking. See *Atomic Radiation and Polylmers*, A. Charlesby, Pergamon Press, (1960).

The contrast of the resist, i.e., the sharpness of its response to changes in dose, is an important characteristic. A high contrast resist is less likely to be partially exposed by scattered electrons or other radiation. The contrast of the resist is a function of the molecular weight distribution of polymers. This distribution is conveniently described by the ratio of weight-average molecular weight to number-average molecular weight. (P. J. Flory, *Principles of Polymer Chemistry*, Chapter VIII, pages 318-345 Cornell University Press, Ithaca, N.Y. (1953)). The ratio is conveniently available from gel permeation chromatography. (E. P. Otocka, "Modern Gel Permeation Chromatography" in *Accounts of Chemical Research*, (October 1973)).

E. Device Fabrication

The following general procedure is fairly descriptive of a usable technique. Resist material is dissolved in a suitable solvent, such as, chlorobenzene and is filtered, for example, through a filter with a pore size of 0.2 μm or less. A substrate surface is wetted by the solution. Adequate thickness uniformity results from spin coating at from 1000 to 10,000 rpm.

The resultant coating is then baked to remove excess solvent. Equivalent results have been produced by baking in vacuum, in air, or in an inert atmosphere, such as, nitrogen. A suitable temperature range is from 50 degrees C. to 100 degrees C. for a period of from five to thirty minutes. This is not a critical step, and it is only necessary to produce a coating which is solvent-free without premature cross-linking. The ranges set forth are sufficient to assure drying without measurable cross-linking.

Exposure may be carried out with X-ray wavelength of from 0.5 to 10 Angstrom units for periods dependent on absorption. Electron beam voltage of from 3 to 30 kilovolts with an integrated incident dose of from $2 \times 10^{-7}$ to $1 \times 10^{-5}$ Coulombs/square centimeter results in usable resist thickness for many purposes. Retention of an entire film thickness of 1 μm requires a dose of about $10 \times 10^{-6}$ Coulombs/cm$^2$.

Development, that is dissolution of the unexposed portion of the film, may be carried out in any suitable solvent. Comparative examples reported herein were carried out with mixtures of methyl ethyl ketone and ethanol. Development may be by simple immersion or by spraying. Images in accordance with the examples were produced with development times of from 20 to 60 seconds. Since the cross-linked film is substantially insoluble in suitable solvent systems, development times noted may be exceeded by a factor of 10 or more without significant impairment of contrast.

Developed images are post-baked primarily to improve adhesion (by removal of developer) and sometimes to increase cross-linking. The post-bake is even less critical than the initial baking, since exceeding temperature or time can only result in greater crosslinking. Temperatures of from 60-180 degrees C. for time periods of from five to 120 minutes are exemplary. Again, this baking step may be carried out in vacuum or inert atmosphere.

This section is largely in terms of fabrication of large scale integrated circuits, LSIs. At this time most significant contemplated use concerns fabrication in/on epitaxial silicon layers supported by silicon substrates. There is also interest in other semiconductors as well as in magnetic devices such as bubble devices. Fabrication of typical bubble devices involves patterning of magnetic garnet epitaxial layers and permalloy. Integrated optic circuits represent another example of fine line devices which may be fabricated by use of the invention. Materials to be patterned may include $SiO_2$, $LiNbO_3$, $LiTaO_3$, etc.

The inventive teaching is of particular significance in the fabrication of fine features by dry processing. However, commercial practice which favors minimum inventory and efficient use of apparatus may result in use in less demanding processing steps as well.

A brief fabrication outline of a silicon integrated circuit is set forth for illustrative purposes. The procedure contemplates use of a silicon wafer bearing an epitaxial layer of device grade silicon of appropriate conductivity type, resistivity, thickness, etc. The listing is generally in a form appropriate for MOS fabrication. A variety of alternatives which may concern bipolar, as well as MOS devices, are contemplated. Each of the enumerated steps assumes prior deposition, delineation, and processing to result in a completed resist pattern. The outline is in tabular form with each step where suitable in terms of two alternative entries—the first directed to wet processing and the second to dry. Also unstated, but common to each level with the possible exception of the terminal step, (unless otherwise noted) is stripping of the resist pattern after processing.

Dry processing contemplates modification of bared regions of substrate by a vapor agent. For these purposes, dry processing contemplates all nonliquid/nonsolid media whether uncharged or charged; whether of balanced or unbalanced charge. The term "plasma" is used without regard to special meanings sometimes assigned by specialists in different disciplines—e.g., it does not necessarily connote a medium within a volume in which charges are balanced on a macroscale. At this time, a variety of dry processing steps are in use. Descriptive terms sometimes overlapping but all contemplated where the term dry processing is used include: ion etching, ion beam milling, reactive ion etching, plasma etching, reactive sputter etching, sputter etching, and gas phase chemical etching.

Dry processes may also be designed to modify underlying substrates through material introduction or other mechanism, as well as removal. Such dry processing may involve true material addition as an implantation, vacuum deposition, sputter deposition, as well as deposition through reduction or oxidation reactions; or other change, such as, local strain enhancement, e.g., as resulting from lattice distortion due to high energy bombardment. The enumeration is not intended to be exhaustive.

Inverse masking (lift-off) is conventionally used for delineating final metallization levels, e.g., on semiconductor devices, as well as photomask patterns. The process entails pattern delineation of the resist followed by flood deposition (overall deposition covering both masked and unmasked regions) of the desired film and subsequent stripping of the resist-film in a suitable solvent. To the skilled artisan, it is meaningful to consider such a combined process as "dry processing" for the reason that flood deposition—ordinarily by use of a vapor species—is resolution controlling.

All such designated species, as well as others that may evolve, are desirably incorporated in circuit fabrication, generally, to more easily realize fine resolution and line width control.

While an advantage of the inventive resists is their comparative stability to dry processing media, they have been found suitable for wet processing procedures, as well. It is not generally alleged that these resists are necessarily superior to known resists in use at this time. It is possible that their use in wet processing may be a matter of convenience. In general, in commercial processing economy in use of apparatus as well as in inventory control is realized by minimizing the number of agents used. Wet etching contemplated, therefore, includes the whole spectrum of procedures in use or to be used. A listing of contemplated wet processes includes: liquid etching, electrode, electroless, or displacement plating.

Silicon LSI Fabrication Procedures (1) Etching of CVD Silicon Nitride

DRY:
Reactor: Parallel plate (Conditions noted are for a 15" diameter reactor)
Gas mixture: 80–75 vol. % tetrafluoromethane (TFM)-remainder oxygen
Power: 75–450 watts
Pressure: 0.1–0.5 Torr
Flow Rate: 60–250 cubic centimeters/minute
Etch Rate: 100–300 nanometers/minute (2) Etching of Pyrolytic Silicon Nitride DRY:
Reactor: Parallel plate (conditions noted are for a 15" diameter reactor)
Gas Mixture: 40–65 vol. % perfluoroethane remainder trifluoromethane
Power: 750–1250 watts
Pressure: 0.5–0.9 Torr
Flow rate: 60–120 cu. cm/min.
Etch rate: 15–35 nanometers/min.

(3) Etching of Phosphorous Doped Glass

WET:
The liquid etch is a solution of 15 parts by volume hydrofluoric acid; 10 parts by volume nitric acid; and 300 parts by volume water. The etch rate from this mixture is approximately 12–15 micrometers/min.
DRY:
Dry etching conditions are identical to that of pyrolytic silicon nitride with a resulting etch rate of 100–200 micrometers/min.

(4) Etching of Polysilicon

WET:
The liquid etchant is a mixture of 3 parts by volume hydrofluoric acid and 5 parts by volume nitric acid. The etch rate, typically 20 nanometers/min., is dependent on the type of amorphous silicon being etched.
DRY: Isotropic Dry Etching
Reactor: 15" diameter parallel plate.
Gas Mixture: 85–95 vol. % carbon tetrafluoride, remainder oxygen.
Power: 100–300 watts
Pressure: 0.2–0.4 Torr
Flow rate: 90–160 cu. cm/min.
Etch rate: 100–200 nanometers/min.
DRY: Anisotropic Dry Etching
Reactor: 15" diameter parallel plate
Gas Mixture: 70–90 vol. % perfluoroethane remainder trifluorocholomethane
Power: 300–800 watts
Pressure: 0.2–0.5 cu. cm/min.
Flow rate: 60–150 cu. cm/min.
Etch rate: 80–130 nanometers/min.

(5) Etching of Aluminum and Aluminum Alloys

WET:
The wet etchant is a mixture of 85 parts by volume phosphoric acid; 5 parts acetic acid; 5 parts nitric acid; and 5 parts water. The etch rate is approximately 1 micrometer/min.
DRY:
Reactor: 15" diameter parallel plate
Gas Mixture: 75–95 Vol. % carbon tetrachloride, remainder helium.
Power: 1,000–2,000 watts
Pressure: 0.2–0.5 Torr
Flow rate: 900–1500 cm$^3$/min for CCl$_4$ with He flow rate is adjusted to result in the desired total pressure.
Etch rate: 800–1500 nanometers/min. Currently this is the most rigorous of all plasma etching conditions with the resist frequently being subjected to temperatures in excess of 250 degrees C.

(6) Etching of Silicon Dioxide (thermal & CVD)

WET:
The liquid etchant is a standard buffered aqueous solution containing 34.6 weight percent ammonium fluoride and 6.8 weight percent hydrofluoric acid. The etch rate of this mixture is 100 nanometers/minute.
DRY:
Dry etching is done using the same conditions as phosphorous doped glass resulting in an etch rate of 60–100 nanometers/min. Examples 7, 8, and 10 relate to dry processing.

(7) Ten grams of the material prepared in Example 1 is dissolved in 100 ml of distilled chlorobenzene and filtered through a 0.2 micrometer filter. A silicon wafer with 0.5 micrometer of aluminum film is spin coated at 2,000 rpm with this resist solution. The resist-coated substrate is prebaked at 90 degrees C. for 15 minutes and exposed with a scanning electron beam to a dose of 3.5 microcoulombs/cm$^2$ at 20 kilovolts. Development of the exposed film is effected by spraying a solution of 5 parts methyl ethyl ketone and 1.6 parts of ethanol for 45 seconds; this is followed by a 30 second spray of 2-propanol. The substrate and patterned resist is baked at 170 degrees C. for two hours. The substrate and resist is subjected to an oxygen plasma with the following conditions; Pressure, 1 Torr; Gas, wet air; Power, 200 watts; Reactor, 12" diameter tube. The purpose of this step is to remove any film residue in the bared areas. The bared aluminum is etched in a plasma-assisted dry etching procedure as previously described under 5. Etching of Aluminum and Aluminum Alloys (DRY). This plasma-assisted etching results in some polymer flow and in removal of approximately 35 percent of the polymer film. The resulting resolution is 1 micrometer.

(8) The procedure of Example 7 is repeated with the exception that an oxidized silicon substrate with a thickness of 0.5 micrometers is used. Etching of the silicon dioxide is effected with a plasma assisted etching technique as described in (6) Etching of Silicon Dioxide, (DRY). The resolution in this system is found to be at least 0.5 micrometers.

(9) The procedure of Example 8 is repeated with the exception that a liquid etching technique described in (6) Etching of Silicon Dioxide (WET).

(10) The procedure of Example 7 is repeated with the exception that a 1.0 micrometer polysilicon film is deposited on the silicon wafer prior to resist application. Etching of the polysilicon film is effected with a plasma assisted etching technique as described in (4) Etching of Polysilicon (DRY).

F. Other Considerations

Appended claims recite or imply a number of considerations well known to those conversant with the concerned art. For example, it is recognized that electron beam resists are economically justifiable primarily where desired resolution is finer than that readily obtainable by photolithographic techniques. Accordingly, it is common practice to utilize focused electron beams capable of resolving desired detail. In present terms, this implies resolution limits of the order of a small number of micrometers or less and suggests the use of focused beams of the order of 1 micrometer or less. It is common practice to define the diameter of a beam of radiant energy in terms of the cross-sectional dimension through which the energy drop-off attains a minimum level of 1/e th of the center energy.

While fine resolution is the usual justification for e-beam lithography, apparatus is sometimes utilized in other modes. For example, available apparatus may provide for larger focused beam cross-sections or even defocused beams.

A recently developed procedure utilizes a cathode shaped to emit a desired pattern. Such a cathode which may emit electrons upon irradiation with X-ray or shorter wavelength wave energy is capable of high resolution pattern delineation when closely spaced from the resist layer. To this end, spacings may be 0.25 micrometers or less.

We claim:

1. Article designed for pattern delineation by procedures including selectively exposing to actinic radiation comprising a substrate and an overlying layer of actinic radiation-sensitive material, and an intermediate layer between said substrate and said overlying layer, said material consisting essentially of polymeric material, CHARACTERIZED IN THAT the said polymeric material consists of a polymer which may be regarded as containing at least 20 weight percent of at least one composition structurally represented as

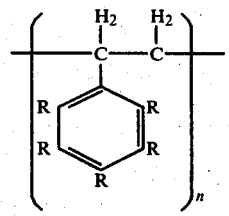

in which at least one of the R substituents is a grouping represented as —R'Z in which the R'Z groupings need not be identical and in which Z is a halogen ion, and R' is any grouping containing from 1 to 4 atoms bridging the Z halogen to the aromatic ring, and in which any other R substituents are selected from the group consisting of hydrogen, methyl, or higher alkyl.

2. Article of claim 1 in which the substrate comprises a layer of material of a composition selected from the group consisting of chromium and oxidized chromium and in which the overlying layer is in intimate contact with the said layer.

3. Article of claim 1 or 2 in which the said polymer is a copolymer which contains at least one comonomer as represented by the structural formula

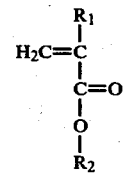

in which $R_1$ equals $CH_3$, Cl, Br, CN and $R_2$ equals

or alkyl (aliphatic or cyclic) group containing from 1 to 6 carbon atoms, with the said comonomer being included in amount of up to about 40 weight percent of the total polymer composition which may be structurally represented as

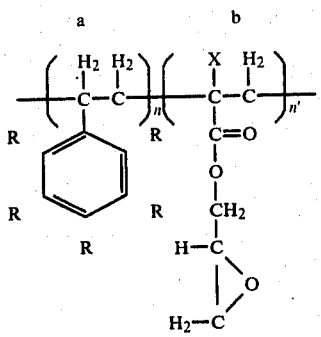

in which X equals H, CH₃, C₂H₅ or other alkyl containing from 1 to 4 carbons; at least one of the R substituents is a grouping represented as —R'Z in which the R'Z groupings need not be identical and in which Z is a halogen atom; R' equals any grouping containing from 1 to 4 atoms bridging the Z halogen to the aromatic ring, and any other R substituents are hydrogen, methylene or higher alkyl homologue.

4. Article of claim 3 in which the "a" monomer is chloromethyl styrene.

5. Article of claim 4 in which n and n' is each within a range of from 0.2 to 0.8 with n plus n' numerically equal to one.

* * * * *